(12) United States Patent
Li

(10) Patent No.: US 10,263,618 B2
(45) Date of Patent: Apr. 16, 2019

(54) PHOTOELECTRIC KEYBOARD BUTTON

(71) Applicant: Dongguan Mingjian Technology Co., Ltd, Guangdong (CN)

(72) Inventor: Jianping Li, Guangdong (CN)

( * ) Notice: Subject to any disclaimer, the term of this patent is extended or adjusted under 35 U.S.C. 154(b) by 207 days.

(21) Appl. No.: 15/531,449

(22) PCT Filed: Oct. 30, 2015

(86) PCT No.: PCT/CN2015/093364
§ 371 (c)(1),
(2) Date: May 29, 2017

(87) PCT Pub. No.: WO2017/035934
PCT Pub. Date: Mar. 9, 2017

(65) Prior Publication Data
US 2017/0264294 A1    Sep. 14, 2017

(30) Foreign Application Priority Data
Aug. 31, 2015 (CN) .......................... 2015 1 0548682

(51) Int. Cl.
*H03K 17/96* (2006.01)
*H03K 17/969* (2006.01)
*H01H 13/70* (2006.01)

(52) U.S. Cl.
CPC .......... *H03K 17/969* (2013.01); *H01H 13/70* (2013.01); *H01H 2219/054* (2013.01); *H01H 2239/022* (2013.01)

(58) Field of Classification Search
CPC ................ H03K 17/969; H01H 13/70; H01H 2239/022; H01H 2219/054
See application file for complete search history.

(56) References Cited

U.S. PATENT DOCUMENTS 9,634,661 B1* 4/2017 Chen .................... H03K 17/969
2018/0047530 A1* 2/2018 Song ..................... G06F 1/1662

* cited by examiner

*Primary Examiner* — Tony Ko
(74) *Attorney, Agent, or Firm* — Prakash Nama; Global IP Services, PLLC

(57) ABSTRACT

Disclosed is a photoelectric keyboard button, comprising: a circuit board (1) for providing a circuit connection, a mounting hole (11) being provided on the circuit board; an optocoupler assembly (2) provided on the circuit board and comprising a transmitting element (21) and a receiving element (22) provided on a side of the mounting hole; a button base (3), which is mounted into the mounting hole and is opened from the top to the bottom to form a guide basket (31), wherein a light passing groove (32) is provided on the guide basket for allowing the transmitting element and the receiving element to form a light passage; a pressing shaft (4), which is mounted into the guide basket and can slide up and down along the guide basket; and a hammer (5) vertically provided inside the guide basket, wherein the two ends thereof are respectively connected to the pressing shaft and the guide basket via springs (6, 7), a shifting block (51) connected to the pressing shaft is provided on a side surface of the hammer, and the hammer is provided with a light pathway switch (52). When being pressed down or bouncing up, the pressing shaft pushes the hammer to rotate horizontally and reciprocally via the shifting block, so as to rotate the light pathway switch to respectively switch on or off the light passage between the transmitting element and the receiving element. The photoelectric keyboard button can present an evident feeling for the difference between pressing and touching operations and a key press sound, has a higher coupling efficiency, and does not easily gather dust.

9 Claims, 5 Drawing Sheets

PHOTOELECTRIC KEYBOARD BUTTON

BACKGROUND OF THE INVENTION

The present invention relates to key, and in particular, to key for a photoelectric keyboard.

Conventionally, the keys for a keyboard are divided into types of mechanical contact and photoelectric switch, in which instead of the mechanical contact structure the type of photoelectric switch uses photoelectric coupler technology, which uses the principles of optics and the photoelectric coupling technology. Light path is formed by a transmitting element and a receiving element. A light resisting part is proceeded to open and close the light path to change the impedance of the circuit, realizing the on/off of the circuit. The photoelectric switch key is long in lifetime, and small in the change of hand feeling after long time use, compared to other keyboards.

However, the keys of current existing photoelectric switch keyboard suffered from the following disadvantages:

1. As there is no light path collimation and light concentration design between a transmitter and a receiver, the efficiency of photoelectric coupling of the transmitter and the receiver is lower.
2. When dusts are deposited within the key, the sensitivity of the photoelectric coupler is further reduced.
3. The hand feeling of the key is unitary, and the touch sense for the key is not obvious.

BRIEF SUMMARY OF THE INVENTION

In order to overcome the shortcomings of the prior art, the present invention suggests key of photoelectric keyboards, which have apparent step feeling when contacting, apparently enhance the photoelectric coupling efficiency, and are able to reach a better antidusting effect.

In order to solve the above goals the present invention adopts the following solutions.

Key for a photoelectric keyboard comprise:

a circuit board for providing a circuit connection, and on which a mounting hole is provided;

an optocoupler assembly, which is provided on the circuit board, comprising a transmitting element and a receiving element both on the side where the mounting hole is located;

a key seat, which is mounted into the mounting hole, and in which an opening from top to bottom is provided to form a guide basket, which is provided with a light passing slot on its sidewall for forming a light path for the transmitting element and the receiving element;

a press shaft, which is mounted into the guide basket and may be slid up and down along the guide basket;

a ram, which is uprightly located in the guide basket, and the upper end and the lower end of which are connected to the press shaft and the guide basket through springs respectively, the side face of the ram having a toggle connected to the press shaft, the ram having a light path switch, the ram forced by the toggle to rotate to and fro horizontally when the press shaft is pressed or upraised, for rotating the light path switch to open the light path between the transmitting element and the receiving element.

Wherein the optocoupler assembly may be selectively provided on the front side or back side of the circuit board.

Wherein the bottom of the guide basket has a limit boss, the top of which has a pair of side stops, and the bottom of which has a flat hole for the free insert of the bottom of ram, the shape of the bottom of ram fitting that of the flat hole.

Compared to the prior art, the advantageous effects of the present invention is that:

(1) when the key is touched, the cooperation between the ram and the limit boss is able to present an apparent touching step feeling and a press sound;

(2) the external stray light interference outside the optocoupler assembly may be shielded by the light path switch on the ram, and the coupling efficiency is higher;

(3) since the optocoupler assembly is shielded by the circuit board or the key seat, it is not easy to deposit dusts.

The present invention will be further described below along with the drawings and the implementations of the specification.

DETAILED DESCRIPTION OF THE INVENTION

Figure 1:
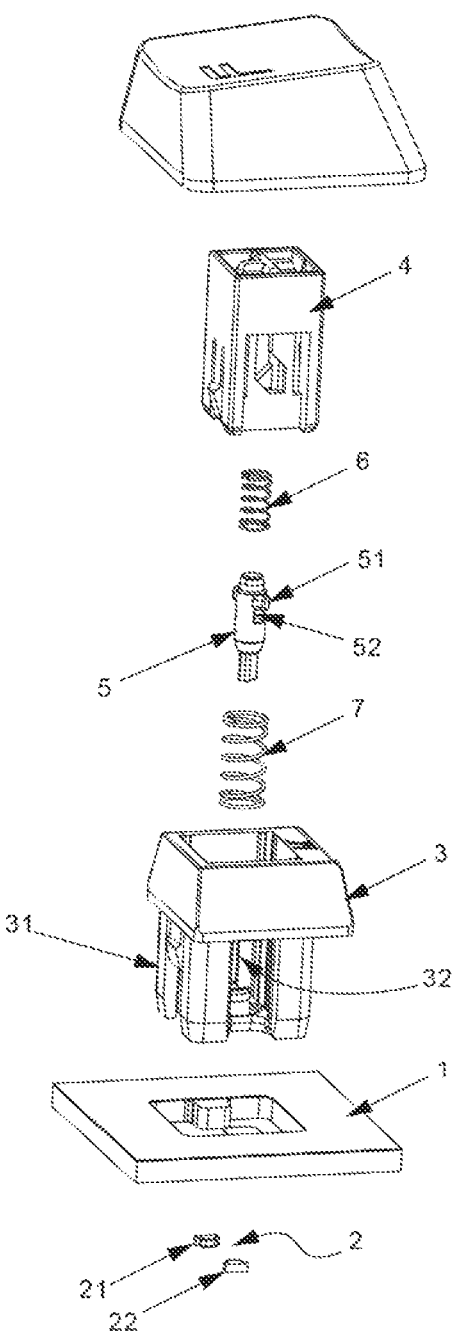
FIG. 1 is a structural exploded schematic view of the invention.

As shown in FIG. 1-6, key of a photoelectric keyboard comprise:

a circuit board for providing circuit connection, in which a mounting hole 11 is provided;

an optocoupler assembly 12, which is provided on the circuit board 1, comprising a transmitting element 21 and the receiving element 22 on the side where mounting hole is located;

a key seat 3, which is mounted into the mounting hole 11, and in which an opening from top to bottom is provided to form a guide basket 31, which is provided with a light passing slot on its sidewall for forming a light path for the transmitting element 21 and the receiving element 22;

a press shaft 4, which is mounted into the guide basket 31 and may be slid and up and down along the guide basket 31;

a ram 5, which is uprightly located in the guide basket 31, and the upper end and the lower end both of which are respectively connected to the press shaft 4 and the guide basket 31 through springs 6 and 7, the side face of the ram having a toggle 51 connected to the press shaft 4, the ram 5 having a light path switch 52, the ram 5 forced by the toggle 51 to rotate to and fro horizontally when the press shaft 3 pressed or upraised, for rotating the path switch 52 to close or open the light path between the transmitting element and the receiving element respectively.

Figure 5:
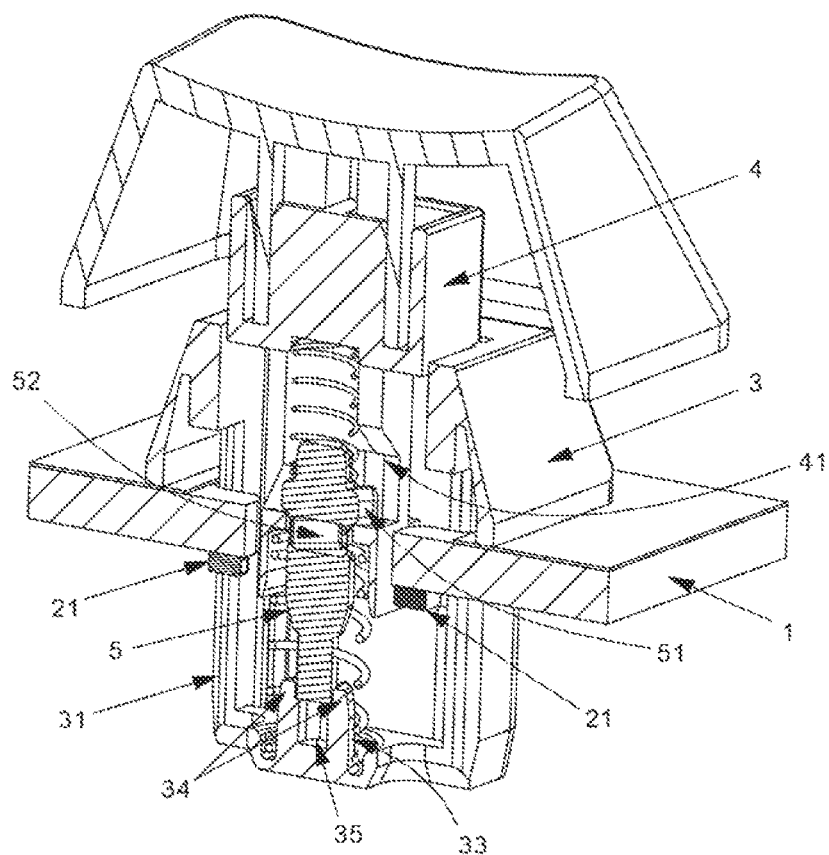
FIG. 5 is a structural schematic view of an embodiment of the invention with the key in upraised state.
Figure 6:
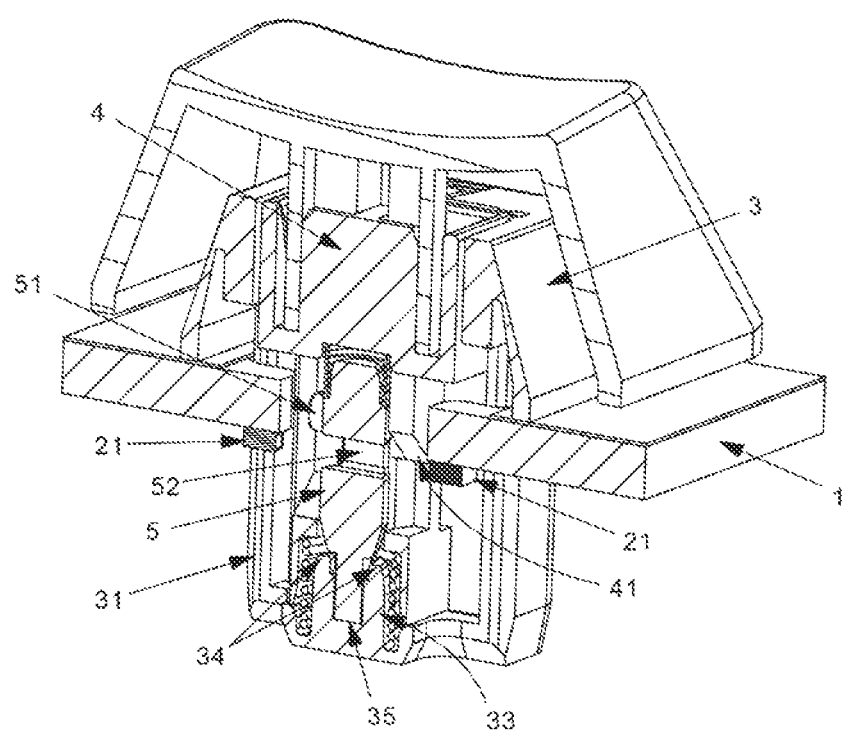
FIG. 6 is another structural schematic view of the embodiment shown in FIG. 5 with the key in pressed state.

As shown in FIG. 5 and FIG. 6, in a preferable implementation, the optocoupler assembly 2 is provided on the backside of the circuit board 1. As the optocoupler assembly 2 is provided on the backside of the circuit board 1 where is not easily accessible for dusts, the optocoupler assembly 2 is generally not affected by dust deposition. Furthermore, the dusts are also blocked by the key seat 3, which is mounted into the mounting hole, from entering the backside of the circuit board, thus further the optocoupler assembly 2 is not affected by the dust deposition.

Figure 2:
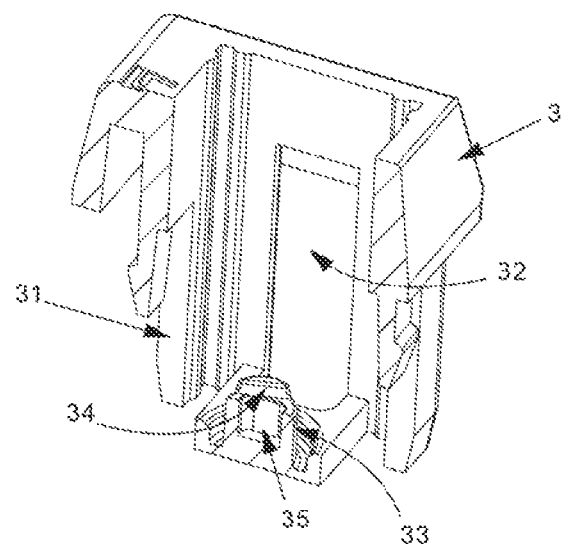
FIG. 2 is a cross section view of the key seat of the invention.

As shown in FIG. 2, the bottom of the guide basket 31 has a limit boss 33, the top of which has a pair of side stops 34, and the bottom of which has a flat hole 35 for the free insert of the bottom of ram 5, the shape of the bottom of ram 5 fitting that of the flat hole 35. As shown in FIG. 5, the bottom of the ram is confined between the side stops 34 when the key is in the upraised state; as shown in FIG. 6, the bottom of the ram 5 is inserted and confined in the flat hole 35 when the key is in the pressed state. When the key is switched between the upraised state and the pressed state, the cooperation between the ram 5 and the limit boss 33 is able to present an apparent touch step feeling and a press sound.

Figure 3:
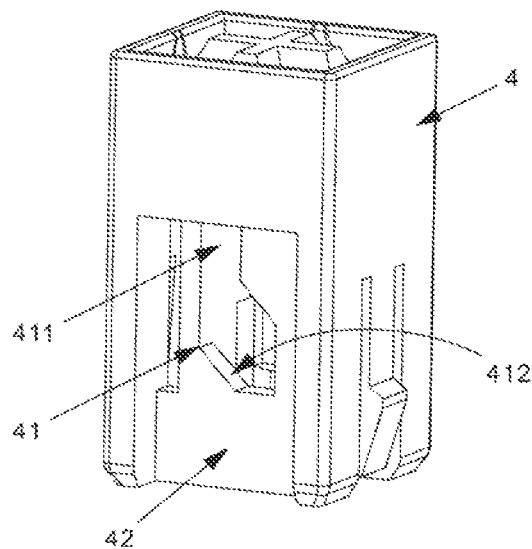
FIG. 3 is a structural schematic view of the press shaft of the invention.

As shown in FIG. 3, said press shaft 4 is provided with a chute for toggle sliding in it, the upper portion of which is an upright guide slot 411, and the lower portion of which is an oblique guide slot 412; as shown in FIG. 5 and FIG. 6, when the press shaft 4 is pressed, the toggle 51 is slid from the oblique guide slot 412 to the upright guide slot 411 for forcing the ram 5 to rotate unidirectionally and remain still; when the press shaft is upraised, the toggle 51 is slid from the upright guide slot 411 to oblique guide slot 412 for forcing the ram 5 to rotate oppositely and remain still.

As shown in FIG. 3, in a preferable implementation, an inner cartridge is provided within said press shaft 4 to enable the ram 5 to freely insert into, said chute 41 is positioned on the sidewall of the inner cartridge.

Figure 4:
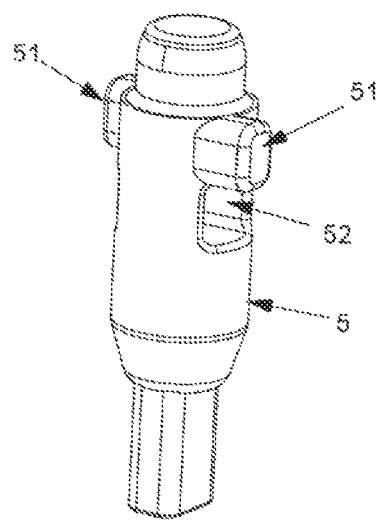
FIG. 4 is a structural schematic view of the ram of the invention.

As shown in FIG. 4 and FIG. 5, in a preferable implementation, said ram 5 has two centrosymmetrically disposed toggles 51, which also are provided with two centrosymmetrically disposed chutes.

As shown in FIG. 5 and FIG. 6, in an implementation of the invention, said transmitting element 21 and the receiving element 22 are located on the two opposite sides of the mounting hole, and said light path switch 52 is a light passing hole that passes throughout the ram 5; As shown in FIG. 5, when the press shaft is pressed, the light passing hole forms a light path of the transmitting element 21 and the receiving element 22; As shown in FIG. 6, when the press shaft 4 is upraised, the light passing hole is deflected on the light path of the transmitting element 21 and the receiving element 22 and blocks it. In this implementation, in the upraised state of the key, the stray optical signal leaked to surrounding space by the transmitting element 21 cannot transfer to the receiving element 22, while in the pressed state of the key, the valid optical signal of the transmitting element 21 may be concentrated to the receiving element 22 better, thereby achieving higher coupling efficiency and also higher accuracy of the photoelectric switch.

Figure 7:
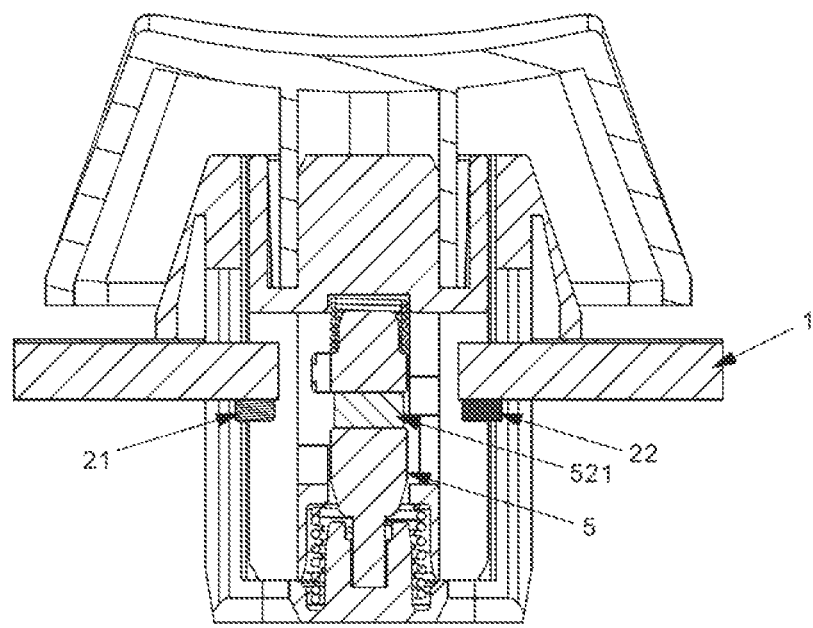
FIG. 7 is a structural schematic view of another embodiment of the invention.

As shown in FIG. 7, in another implementation of the invention, a light guide is provided in said light passing hole. Compared to previous implementation, the light guide 521 may further enhance the effect that the valid optical signal of the transmitting element 21 is concentrated to the receiving element 22, thereby further enhancing the coupling efficiency and the accuracy of the photoelectric switch.

Figure 8:
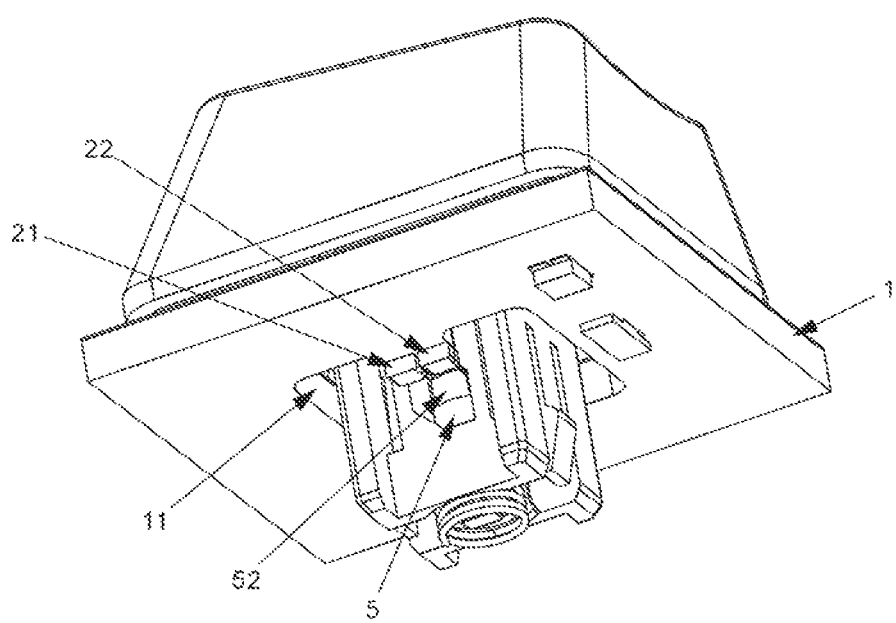
FIG. 8 is a structural schematic view of yet another embodiment of the invention.

As shown in FIG. 8, another implementation of the invention, said transmitting element 21 and receiving element 22 are located on the same side of the mounting hole respectively; said light path switch 52 is a reflector provided on the ram 5; and, the light path of the transmitting element 21 and the receiving element 22 is constructed by the reflection of the reflector when the press shaft 4 is pressed, while the light path of the transmitting element and the receiving element 22 is deflected and blocked when the press shaft 4 is upraised. In this implementation, with the upraised state of the key, the stray optical signal leaked to the surrounding space by the transmitting element 21 can not transfer to the receiving element 22; with the pressed state of the key, the valid optical signal of the transmitting element 21 may be concentrated to the receiving element 22 better by the reflector, thereby achieving higher coupling efficiency and also higher accuracy of the photoelectric switch.

As for the skilled in the art, various other corresponding changes and variants may be obtained according to the structures and principles disclosed by the present invention, and all of these changes and variants are fallen into the protect scope of the present invention. For example, the transmitting element 21 and the receiving element 22 may adopt a plug-in chip or a patch chip. Its reflecting side face may be designed as condensing lens structure when the transmitting element 21 and the receiving element 22 adopt the patch chip.

What is claimed is:

1. key for a photoelectric keyboard, characterized in, comprising:
   a circuit board for providing circuit connection, on which a mounting hole is provided;
   an optocoupler assembly, which is provided on the circuit board, comprising a transmitting element and a receiving element both on the side where the mounting hole is located;
   a key seat, which is mounted into the mounting hole, and on which an opening from top to bottom is provided to form a guide basket;
   a press shaft, which is mounted into the guide basket and may be slid up and down along the guide basket;
   a ram, which is uprightly located in the guide basket, and the upper end and the lower end of which are connected to the press shaft and the guide basket through springs respectively, the side face of the ram having a toggle connected to the press shaft, the ram having a light path switch, the ram forced by the toggle to rotate to and fro horizontally when the press shaft is pressed or upraised, for rotating the light path switch to close or open the light path between the transmitting element and the receiving element.

2. The key for a photoelectric keyboard according to claim 1, characterized in that: the optocoupler assembly is provided on the front side or back side of the circuit board.

3. The key for a photoelectric keyboard according to claim 1, characterized in that: the bottom of the guide basket has a limit boss, the top of which has a pair of side stops, and the bottom of which has a flat hole for the free insert of the bottom of ram, the shape of the bottom of ram fitting that of the flat hole.

4. The key for a photoelectric keyboard according to claim 1, characterized in that: the press shaft is provided with a chute for toggle sliding in it, the upper portion of which is an upright guide slot , and the lower portion of which is an oblique guide slot; when the press shaft is pressed, the toggle is slid from the oblique guide slot to the upright guide slot for forcing the ram to rotate unidirectionally and remain still; when the press shaft is upraised, the toggle is slid from the upright guide slot to oblique guide slot for forcing the ram to rotate oppositely and remain still.

5. The key for a photoelectric keyboard according to claim 4, characterized in that: an inner cartridge is provided within said press shaft to enable the ram to freely insert into, the chute is positioned on the sidewall of the inner cartridge.

6. The key for a photoelectric keyboard according to claim 4, characterized in that: the ram has two centrosymmetrically disposed toggles, which also are provided with two centrosymmetrically disposed chutes.

7. The key for a photoelectric keyboard according to claim 4, characterized in that: the transmitting element and the receiving element are located on the two opposite sides of the mounting hole, and the light path switch is a light passing hole that passes throughout the ram; when the press shaft is pressed, the light passing hole forms a light path of the transmitting element and the receiving element; when the press shaft is upraised, the light passing hole is deflected on the light path of the transmitting element and the receiving element and blocks it.

8. The key for a photoelectric keyboard according to claim 7, characterized in that: a light guide is provide within the light passing hole.

9. The key of a photoelectric keyboard according to claim 1, characterized in that: the transmitting element and receiving element are located on the same side of the mounting hole respectively; the light path switch is a reflector provided on the ram; and, the light path of the transmitting element and the receiving element is constructed by the reflection of the reflector when the press shaft is pressed, while the light path of the transmitting element and the receiving element is deflected and blocked when the press shaft is upraised.

\* \* \* \* \*